United States Patent
Mattisson

(10) Patent No.: US 7,672,659 B2
(45) Date of Patent: Mar. 2, 2010

(54) MIXER WITH FEEDBACK

(75) Inventor: Sven Mattisson, Bjärred (SE)

(73) Assignee: Telefonaktiebolaget L M Ericsson (Publ), Stockholm (SE)

( * ) Notice: Subject to any disclaimer, the term of this patent is extended or adjusted under 35 U.S.C. 154(b) by 379 days.

(21) Appl. No.: 10/746,330

(22) Filed: Dec. 23, 2003

(65) Prior Publication Data

US 2004/0176064 A1 Sep. 9, 2004

Related U.S. Application Data

(63) Continuation-in-part of application No. 10/400,114, filed on Mar. 26, 2003, now Pat. No. 7,054,609, which is a continuation-in-part of application No. 10/383,370, filed on Mar. 6, 2003, now Pat. No. 6,891,423.

(60) Provisional application No. 60/370,322, filed on Apr. 4, 2002.

(51) Int. Cl.
*H04B 1/26* (2006.01)
*H04B 1/28* (2006.01)

(52) U.S. Cl. ............... 455/323; 455/326; 455/333; 455/311

(58) Field of Classification Search ........... 455/234.1, 455/240.1, 250.1, 252.1, 266, 326, 333, 302, 455/311; 330/109, 103; 329/349, 350; 327/137
See application file for complete search history.

(56) References Cited

U.S. PATENT DOCUMENTS

| | | | |
|---|---|---|---|
| 3,689,752 A * | 9/1972 | Gilbert | ............ 327/357 |
| 3,864,751 A | 2/1975 | Beaulieu et al. | |
| 4,355,414 A * | 10/1982 | Inoue | ............ 455/184.1 |
| 4,639,806 A | 1/1987 | Kira et al. | |
| 4,663,685 A | 5/1987 | Tsang | |
| 5,108,037 A | 4/1992 | Okamoto et al. | |
| 5,155,724 A | 10/1992 | Edwards | |
| 5,179,731 A | 1/1993 | Tränkle et al. | |
| 5,311,086 A | 5/1994 | Yamaji et al. | |
| 5,410,743 A | 4/1995 | Seely et al. | |

(Continued)

FOREIGN PATENT DOCUMENTS

DE 195 23 433 A1 1/1997

(Continued)

OTHER PUBLICATIONS

Abidi, A,, "CMOS Wireless Transceivers: The New Wave", IEEE Communications Magazine, vol. 37, No. 8, Aug. 1999, pp. 119-124.

(Continued)

*Primary Examiner*—Duc M Nguyen
(74) *Attorney, Agent, or Firm*—Michael G. Cameron

(57) ABSTRACT

A method and system for increasing the compression point of a receiver by deriving a feedback signal from mixer output signals. The feedback signal prevents the receiver from going into compression on strong out-of-band or blocking signals, while enhancing the receiver gain at the desired frequency. The desired frequency coincides with the local oscillator (LO) signal and is therefore particularly applicable for, but not limited to, homodyne receivers where selectivity can be made quite narrowband. Since the selectivity is coupled to the LO, a tunable receiver may be achieved that enables selectivity over a wide range of input frequencies.

1 Claim, 6 Drawing Sheets

U.S. PATENT DOCUMENTS

| | | | |
|---|---|---|---|
| 5,493,713 A * | 2/1996 | Horsfall et al. | 455/236.1 |
| 5,570,056 A | 10/1996 | Groe | |
| 5,589,791 A | 12/1996 | Gilbert | |
| 5,625,307 A * | 4/1997 | Scheinberg | 327/113 |
| 5,732,342 A * | 3/1998 | Roth et al. | 455/234.1 |
| 5,872,446 A | 2/1999 | Cranford, Jr. et al. | |
| 5,898,912 A | 4/1999 | Heck et al. | |
| 6,026,287 A | 2/2000 | Puechberty et al. | |
| 6,037,825 A | 3/2000 | Kung | |
| 6,054,889 A | 4/2000 | Kobayashi | |
| 6,140,849 A * | 10/2000 | Trask | 327/113 |
| 6,226,509 B1 | 5/2001 | Mole et al. | |
| 6,255,889 B1 * | 7/2001 | Branson | 327/359 |
| 6,304,142 B1 | 10/2001 | Madni | |
| 6,310,513 B1 | 10/2001 | Iemura | |
| 6,393,267 B1 * | 5/2002 | Trask | 455/326 |
| 6,396,330 B1 | 5/2002 | Fujii | |
| 6,437,631 B2 | 8/2002 | Amano | 327/359 |
| 6,456,142 B1 * | 9/2002 | Gilbert | 327/356 |
| 7,054,609 B2 * | 5/2006 | Wiklund et al. | 455/323 |
| 7,076,224 B2 * | 7/2006 | Giry-Cassan et al. | 455/241.1 |
| 2001/0001543 A1 | 5/2001 | Sasaki | |
| 2001/0027095 A1 | 10/2001 | Wang | |
| 2001/0036818 A1 | 11/2001 | Dobrovolny | |
| 2002/0008983 A1 | 1/2002 | Souto-Diez et al. | |
| 2002/0163981 A1 * | 11/2002 | Troemel, Jr. | 375/345 |
| 2003/0025623 A1 * | 2/2003 | Brueske et al. | 341/139 |
| 2003/0181180 A1 * | 9/2003 | Darabi et al. | 455/234.1 |

FOREIGN PATENT DOCUMENTS

| | | |
|---|---|---|
| DE | 198 19 092 A 1 | 11/1999 |
| EP | 0 942 526 A1 | 9/1999 |
| EP | 1 137 168 A2 | 9/2001 |
| GB | 2 249 679 A | 5/1992 |
| GB | 2 341 502 A | 3/2000 |
| WO | WO 98/47221 | 10/1998 |

OTHER PUBLICATIONS

Wiklund, et al., "A 2GHz Image-Reject Receiver in a Low IF Architecture Fabricated in a 0.1um CMOS Technology", ESSCIRC, Apr. 4, 2002, pp. 1-4.

* cited by examiner

MIXER WITH FEEDBACK

CROSS-REFERENCE TO RELATED APPLICATIONS

This patent application is a continuation-in-part of U.S. patent application Ser. No. 10/400,114, entitled "Linearity Improvement of Gilbert Mixers," filed on Mar. 26, 2003 now U.S. Pat. No. 7,054,609. U.S. patent application Ser. No. 10/400,114 is a continuation-in-part of U.S. patent application Ser. No. 10/383,370, entitled "Quadrature Switching Mixer," filed on Mar. 6, 2003 now U.S. Pat. No. 6,891,423. U.S. patent application Ser. No. 10/383,370 claims priority from U.S. Provisional Patent App. No. 60/370,322, filed on Apr. 4, 2002. Each of the above-listed applications is incorporated by reference.

BACKGROUND OF THE INVENTION

1. Field of the Invention

This invention is directed generally to radio communication systems and particularly to radio communication systems with integrated receivers.

2. Description of the Related Art

In radio communication systems, a mixer is used to up-convert a baseband signal to a higher frequency (e.g., radio frequency (RF)) signal for ease of transmission. The mixer can also down-convert a high frequency signal to baseband for ease of signal processing. Various types of mixers exist, including unbalanced, single and double balanced, and the four-quadrant or Gilbert mixer. For general information regarding the various types of mixers, the reader is referred to "Radio-Frequency Microelectronic Circuits for Telecommunication Applications," Yannis E. Papananos, ISBN 0-7923-8641-8, Kluwer Academic Publishers, Boston, 1999.

An example of a mixer being employed in a typical receiver 100 is illustrated in FIG. 1. The receiver 100 is a homodyne receiver in which an RF signal is converted directly to a baseband signal (in contrast to a heterodyne receiver where the RF signal is first converted to one or more intermediate frequency (IF) signals). As can be seen, the receiver 100 has a number of functional components, including an antenna 102, a low noise amplifier (LNA) 104, a mixer 106, and a local oscillator (LO) 108, the LO 108 typically being a voltage controlled oscillator (VCO). These components are well known to one skilled in the art and will not be described in detail here. Briefly, the antenna 102 receives and provides the RF signal to the receiver 100. The RF signal is then amplified by the low noise amplifier 104 and mixed by the mixer 106 with a signal from the LO 108. The mixing action recovers the baseband signal from the RF signal, which baseband signal is then outputted at the mixer 106. In most instances, the receiver 100 also includes a post mixer amplifier 110 for amplifying the baseband signal and a low pass filter 112 for removing any high frequency component of the baseband signal.

A challenge in modern radio communication systems has been, and continues to be, to design receivers (and transmitters) that can meet increasingly strict performance standards while fitting into ever shrinking packages. To this end, many modern radio receivers (and transmitters) are implemented on a single application specific integrated circuit (ASIC). Integrated radio receivers, however, cannot easily implement RF selectivity due to the very high quality (Q) factors required in modern communication systems. The Q-factor is a ratio of a channel's center frequency over its allowable spread and is a measure of how tightly the frequency of the channel must be controlled. For example, a channel in the Global System for Mobile Communication (GSM) may have a center frequency of 1.8 GHz and may be 200 kHz wide. This corresponds to an extremely high Q-factor of approximately 9000. Band selectivity is also difficult to implement on a chip. For example, a typical cellular band can be some 50 Mhz wide and, at a center frequency of 1.8 GHz, corresponds to a relatively high Q-factor of approximately 36.

One way to achieve sufficient RF selectivity is to employ surface acoustic wave (SAW) filters. SAW filters are frequently used in radio communication applications because of their high performance characteristics and low insertion loss. In most receivers, a SAW filter is inserted between the antenna and the low noise amplifier to suppress out-of-band signals. For non-TDMA (time domain multiple access) systems where the receiver and transmitter operate simultaneously, a SAW filter is often inserted between the low noise amplifier and the first down-conversion mixer as well. Adding filters, however, has the drawback of increasing the cost, size, and complexity of the receiver.

Moreover, the problem intended to be solved by the additional filters is to suppress unwanted out-of-band signals sufficiently so that these signals do not desensitize the receiver or cause excessive distortion that may hamper the receiver sensitivity. But desensitization and distortion usually become significant only when the power level at the low noise amplifier input approaches the receiver compression point. The receiver compression point is a figure of merit that indicates how much signal power the receiver can handle before the receiver gain begins to be affected. It is generally considered to be the point where the receiver gain is decreased by 1 dB as a result of an increase in the input power. The reason the gain is affected is because beyond a certain point, the output of the receiver becomes saturated and further increases in input power will not result in corresponding increases in output power. By increasing the receiver compression point significantly, desensitization and distortion may be reduced. As a result, it may be possible to avoid some or all of the additional SAW filters.

Accordingly, what is needed is a way to improve the RF selectivity in an integrated receiver using few or no additional components, such as the SAW filters mentioned above. In particular, what is needed is a way to increase the compression point of the receiver, thereby making the receiver less susceptible to desensitization and distortion effects that may hamper the receiver sensitivity.

SUMMARY OF THE INVENTION

The present invention is directed to method and system for increasing the compression point of a receiver by deriving a feedback signal from mixer output signals. The feedback signal prevents the receiver from going into compression on strong out-of-band or blocking signals, while enhancing the receiver gain at the desired frequency. The desired frequency coincides with the LO signal and is therefore particularly applicable for, but not limited to, homodyne receivers where selectivity can be made quite narrow band. Since the selectivity is coupled to the LO, a tunable receiver may be achieved that enables selectivity over a wide range of input frequencies.

In general, in one aspect, the invention is directed to a method of providing feedback from a mixer to a preceding amplifier in a receiver. The method comprises receiving a radio frequency signal at the radio frequency receiver and generating frequency translated signal from the radio frequency signal. The method further comprises deriving a feedback signal from a combination of mixer output signals, the feedback signal being a function of a frequency of the radio frequency signal. The feedback signal is then provided to the preceding amplifier in the receiver.

In general, in another aspect, the invention is directed to a radio frequency receiver having a mixer feedback. The radio frequency receiver comprises a low noise amplifier configured to receive a radio frequency signal, the radio frequency signal having a baseband signal carried thereon. The radio frequency receiver further comprises a mixer configured to mix the radio frequency signal with a local oscillator signal to recover the baseband signal. A feedback network connects the mixer to the low noise amplifier and provides a feedback signal to the low noise amplifier, wherein the feedback signal is a function of a frequency of the radio frequency signal.

In general, in yet another aspect, the invention is directed to a radio frequency receiver having feedback from a mixer of the receiver to an input stage of the receiver. The radio frequency receiver comprises an amplifier configured to receive a radio frequency signal, the radio frequency signal having a baseband signal carried thereon. The radio frequency receiver further comprises a mixer configured to mix the radio frequency signal with a local oscillator signal, the mixer having at least a high-pass output path and a low-pass output path. A feedback network connects the mixer to the low noise amplifier, the feedback network providing a feedback signal from the high-pass output path to the low noise amplifier.

It should be emphasized that the term comprises/comprising, when used in this specification, is taken to specify the presence of stated features, integers, steps, or components, but does not preclude the presence or addition of one or more other features, integers, steps, components, or groups thereof.

BRIEF DESCRIPTION OF THE DRAWINGS

A better understanding of the invention may be had by reference to the following detailed description when taken in conjunction with the accompanying drawings, wherein.

DETAILED DESCRIPTION OF THE INVENTION

Figure 1:
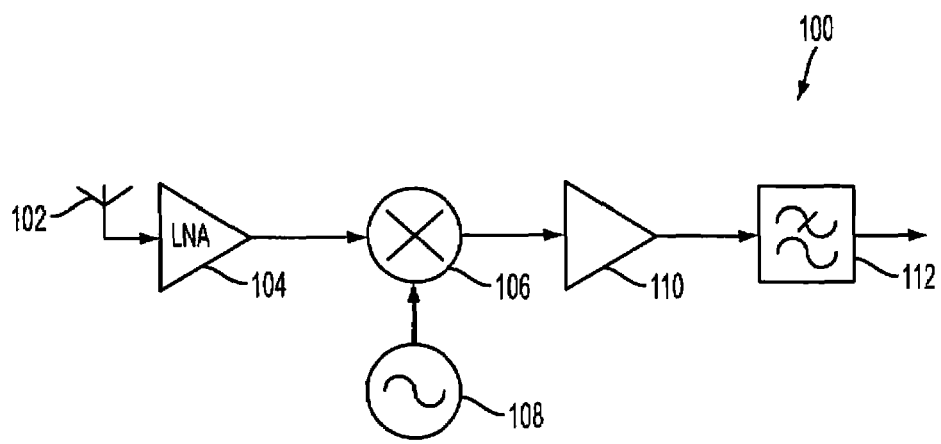
FIG. 1, previously described, is a block diagram of a prior art receiver.

Following is a detailed description of the invention with reference to the drawings wherein reference numerals for the same or similar elements are carried forward. It should be noted that the transistors shown in the drawings are intended to be general in nature and do not indicate a preference for a particular type of transistor. Likewise, the equations provided herein are intended to be general in nature and do not indicate a preference for a specific type of transistor. In addition, all resistors described herein may also be some other form of impedance such as capacitive (C), resistive (R), inductive (L), RC, RL, and the like. In general, the invention is capable of being implemented with any suitable type of transistor (e.g., bi-polar junction transistors (BJT), metal oxide semiconductor field effect transistors (MOSFET), etc.), using any suitable feedback mechanism (e.g., capacitive, resistive, inductive, RC, RL, etc.), and using any suitable biasing scheme (e.g., current source, bootstrap, resistors, LC, etc.).

Embodiments of the invention provide a receiver having a significantly improved compression point. The improvement in the receiver compression point is achieved by providing a feedback between the mixer and the low noise amplifier. The mixer, which may be a conventional mixer, has an output that includes a high-pass path and a low-pass path. The low-pass path is fed to the baseband portion of the receiver (i.e., the IF circuitry). The high-pass path, in accordance with embodiments of the invention, is fed back to the low noise amplifier. This feedback reduces the signal swing seen by the devices within the receiver feedback loop and, as a result, increases the compression point for out-of-band signals (by sacrificing circuit gain for these signals).

The feedback causes the low noise amplifier and mixer combination to behave much like an operational amplifier. Specifically, the output signal of the low noise amplifier will be limited by clipping in the mixer, yet the output swing will not be radically changed by the feedback. The mixer output is typically loaded by a filter and therefore will not usually clip, even on strong out-of-band signals, since they will not develop a large voltage swing (provided the bias current is high enough). In contrast, in the non-feedback case, the compression point will be limited by the input (amplifier) stage regardless of the output compression point of the mixer. By adding feedback from the mixer output to the receiver input stage, it is possible to design the feedback network such that its noise contribution is limited (i.e., little local feedback at the input stage) while the compression point will be set by the mixer output current capability (i.e., clipping). Such an arrangement provides more flexibility for circuit designers.

The dual loop feedback (i.e., the combination of mixer feedback and conventional feedback) also enables the control of, for example, the input impedance of the low noise amplifier mixer combination, which would also be useful in reducing the number of matching components. For example, in general, an amplifier block can be described by four transfer parameters: $1/A_v$, $1/A_i$, $1/G_m$, and $1/R_m$, where $A_v$, $A_i$, $G_m$, and $R_m$ are the voltage gain, current gain, transconductance, and transresistance, respectively. By applying one feedback loop to the amplifier, one transfer parameter can be controlled (e.g., the voltage gain). By applying two loops, two transfer parameters may be controlled. When both the voltage and current gains are controlled, the input impedance will be defined by their ratio and a fixed, well controlled input impedance is achieved. For simplicity, real values (e.g., conductances) have been used in this example, but in practice, the parameters may assume complex, frequency dependent values. (See, for example, Nordholt, Ernst H., "Design of High-Performance Negative-Feedback Amplifiers," Elsevier, 1983, ISBN 0-444-42140-8; and Davidse, Jan, "Analog Electronic Circuit Design," Prentice Hall, 1991, ISBN 0-13-035346-9.)

Furthermore, in some embodiments, the mixer output stage may be made into a class AB amplifier (i.e., an amplifier wherein the conduction angle is larger than $\pi$, but less than $2\pi$), thereby vastly increasing its current drive capability without increasing the average power consumption under normal conditions (much like the output stage in op-amps). (See Davidse, Jan, referenced above for more information regarding class AB amplifiers.) A reasonably high loop gain should be used for optimal performance.

Figure 2:
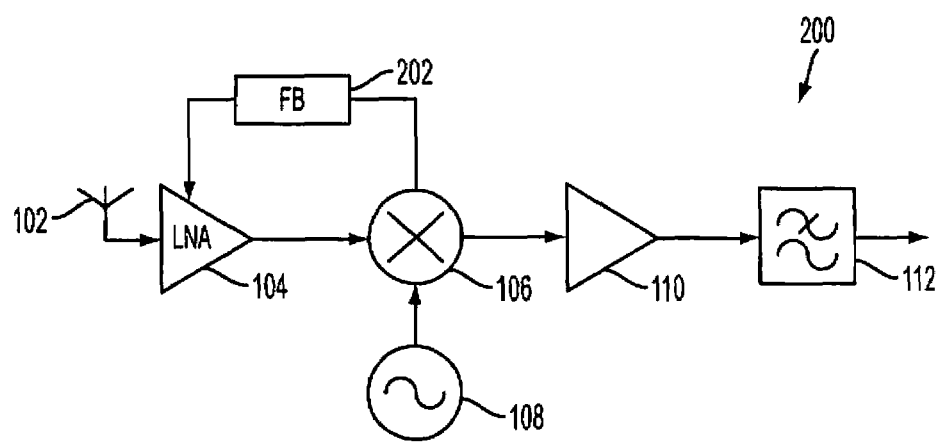
FIG. 2 is block diagram of an exemplary receiver according to embodiments of the invention.

FIG. 2 illustrates a block diagram of a receiver 200 having a mixer feedback according to the teachings of the invention. As can be seen, the receiver 200 has a feedback 202 from the mixer 106 to the low noise amplifier 104. The purpose of the feedback 202 is to prevent the receiver chain from going into compression on stronger blocking signals while enhancing the gain at the desired frequency. By way of explanation, feedback has traditionally been used in low-frequency applications where no signal frequency translation (i.e., mixing) takes place. In these applications, input and output signals, at least for the blocks enclosed by the feedback loop, have the same frequency. Since the frequencies are the same, the receivers can be more easily designed to have a compression point (and linearity) that exceeds the compression point of a non-feedback system.

For frequency translation systems such as the one shown in FIG. 2, however, the input and output signal frequencies of the feedback loop are not the same. As a result, the feedback (i.e., error) signal cannot be derived simply as a scaled down version of the output signal, since the output signal may include components of two or more different frequencies. Therefore, in accordance with the teachings of the invention, the feedback signal is instead derived in terms of the frequency of the input signal.

Figure 3:
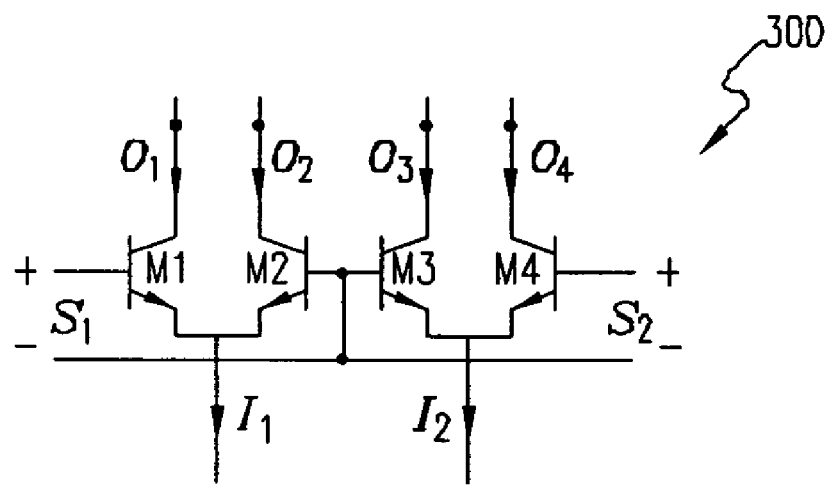
FIG. 3 is a circuit diagram showing a portion of a mixer.

FIG. 3 shows a double-balanced mixer 300 wherein M1-M4 denote transistors that form a mixer core, $O_1$-$O_4$ represent mixer output currents, $I_1$-$I_2$ represent input currents, and $S_1$-$S_2$ represent LO signals. The output currents $O_1$-$O_4$ may be expressed as follows:

$$O_1 = \left(I_0 + \frac{i_s}{2}\cos(\omega_i t)\right) \cdot S_1 \quad (1)$$

$$O_2 = \left(I_0 + \frac{i_s}{2}\cos(\omega_i t)\right) \cdot (1 - S_1) \quad (2)$$

$$O_3 = \left(I_0 - \frac{i_s}{2}\cos(\omega_i t)\right) \cdot (1 - S_2) \quad (3)$$

$$O_4 = \left(I_0 - \frac{i_s}{2}\cos(\omega_i t)\right) \cdot S_2 \quad (4)$$

where $I_0$ represents the mixer bias current, $I_1$ and $I_2$ represent the input signal current plus the mixer bias current ($I_1 + I_2 = 2I_0$), $i_s$ represents the mixer signal current amplitude, $\omega_i$ represents the input signal frequency, and the input signal currents $I_1$ and $I_2$ and LO signal $S_1$ and $S_2$, respectively, can be expressed as $O_{1,2} = I_{1,2} \cdot S_{1,2} = I_C \pm i_s/2 \cos(\omega_i t) \cdot S_{1,2}$, S 1=1-$S_2$. After appropriate substitution and simplification, Equations (1)-(4) may be rewritten as:

$$O_1 \approx \left[I_0 + \frac{i_s}{2}\cos(\omega_i t)\right] \cdot \left[\frac{1}{2} + \frac{2}{\pi}\cos(\omega_0 t) + \ldots\right] = \quad (5)$$
$$\frac{I_0}{2} + \frac{i_s}{4}\cos(\omega_i t) + \frac{2I_0}{\pi}\cos(\omega_0 t) + \frac{i_s}{2\pi}[\cos(\Delta\omega t) + \cos((2\omega_0 + \Delta w)t)]$$

$$O_2 \approx \left[I_0 + \frac{i_s}{2}\cos(\omega_i t)\right] \cdot \left[\frac{1}{2} - \frac{2}{\pi}\cos(\omega_0 t) - \ldots\right] = \quad (6)$$
$$\frac{I_0}{2} + \frac{i_s}{4}\cos(\omega_i t) - \frac{2I_0}{\pi}\cos(\omega_0 t) - \frac{i_s}{2\pi}[\cos(\Delta\omega t) + \cos((2\omega_0 + \Delta w)t)]$$

$$O_3 \approx \left[I_0 - \frac{i_s}{2}\cos(\omega_i t)\right] \cdot \left[\frac{1}{2} - \frac{2}{\pi}\cos(\omega_0 t) - \ldots\right] = \quad (7)$$
$$\frac{I_0}{2} - \frac{i_s}{4}\cos(\omega_i t) - \frac{2I_0}{\pi}\cos(\omega_0 t) + \frac{i_s}{2\pi}[\cos(\Delta\omega t) + \cos((2\omega_0 + \Delta w)t)]$$

$$O_4 \approx \left[I_0 - \frac{i_s}{2}\cos(\omega_i t)\right] \cdot \left[\frac{1}{2} + \frac{2}{\pi}\cos(\omega_0 t) + \ldots\right] = \quad (8)$$
$$\frac{I_0}{2} - \frac{i_s}{4}\cos(\omega_i t) + \frac{2I_0}{\pi}\cos(\omega_0 t) - \frac{i_s}{2\pi}[\cos(\Delta\omega t) + \cos((2\omega_0 + \Delta w)t)]$$

In most receivers, the baseband output $O_{BB}$ is derived as a linear combination of the output currents in Equations (5)-(8), as follows:

$$O_{BB} = O_1 + O_3 - (O_2 + O_4) = \frac{2i_s}{\pi}[\cos(\Delta\omega t) + \cos((2\omega_0 + \Delta\omega)t)] \quad (9)$$

where the $\Delta\omega$ term corresponds to a down converted signal and the $2\omega_0$ term corresponds to an up converted signal, which can easily be removed with a filter, since $\Delta\omega$ and $2\omega_0$ are typically widely separated in frequency.

Note in Equation (9) that there is a total absence of any input signal frequency term. As a result, the traditional baseband mixer output $O_{BB}$ is not feasible as a feedback signal to the low noise amplifier. By combining the mixer output currents expressed in Equations (5)-(8) in a certain way, however, the mixer output can be derived in terms of the input signal frequency, as follows:

$$O_{RF} = O_1 + O_2 - (O_3 + O_4) = i_s \cos(\omega_i t) \quad (10)$$

where $O_{RF}$ is the RF output of the mixer. Note the presence of the input signal frequency term $\omega_i$ in the Equation (10). Thus, by combining the mixer output currents in accordance with teachings of the invention, the mixer output may be derived as a function of the input signal frequency $\omega_i$. And since $\Delta\omega$ and $\omega_i$ are typically widely separated in frequency, both $O_{BB}$ and $O_{RF}$ may be generated.

Figure 4:
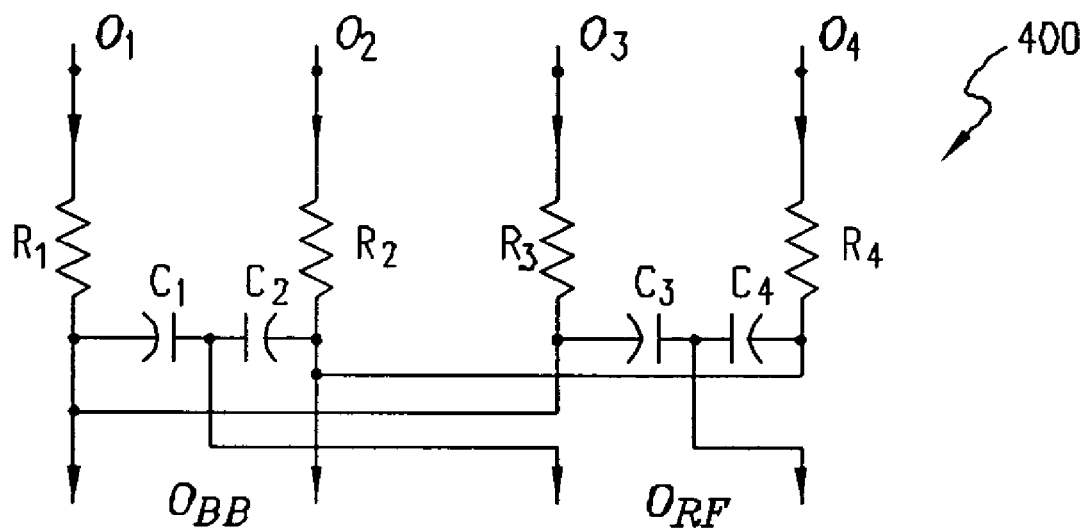
FIG. 4 is a circuit diagram showing an exemplary network that may be used to combine the outputs of a mixer according to embodiments of the invention.

One way to combine the mixer output currents to achieve the above result is by using, for example, a simple passive network. FIG. 4 illustrates an exemplary passive network 400 that can be used to generate the RF output, $O_{RF}$, of the mixer. The network 400 includes resistors R1-R4 and capacitors C1-C4, all interconnected as shown. Applying well known circuit analysis techniques, it can be shown that Equation (10) may be implemented by tapping a connection between C1 & C2 and C3 & C4 to obtain the mixer RF output $O_{RF}$.

Figure 5:
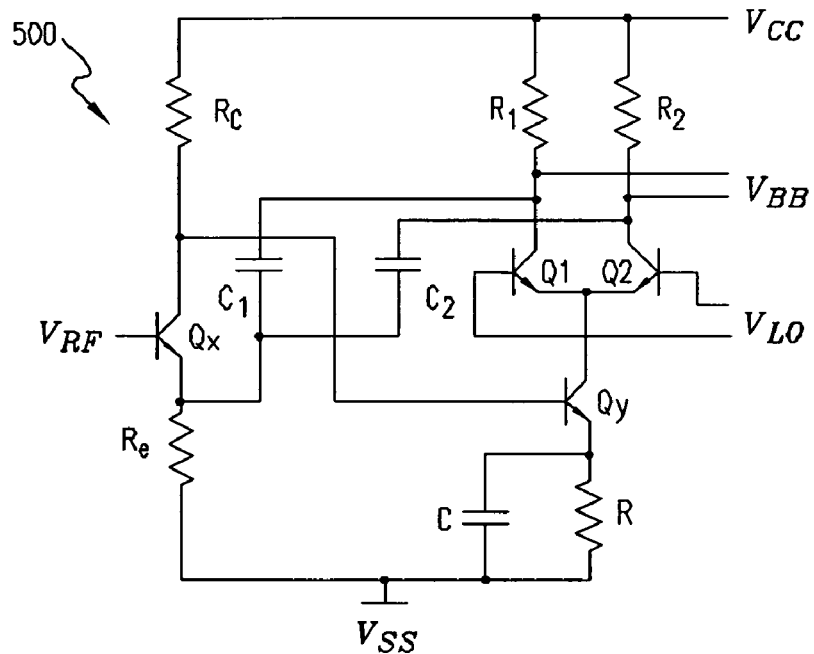
FIG. 5 is a circuit diagram showing a portion of an exemplary receiver having a feedback network according to embodiments of the invention.

An example of how the passive network 400 may be implemented in a mixer is shown in FIG. 5, where bias and other details have been omitted for ease of illustration. FIG. 5 illustrates a typical single-balanced mixer 500 that has been modified in accordance with the teachings of the present invention. Note that although a single-balanced mixer is shown, one skilled in the art may readily expand the concepts herein to include double-balanced mixers, four-quadrant mixers, and other types of mixers.

The single-balanced mixer 500 includes transistors Q1 & Q2 that together form the mixer core, and transistors Qx & Qy that together form the low noise amplifier. Resistors R1 & R2 are connected between the collectors of Q1 & Q2 and the voltage supply Vcc. The resistors R1 & R2 are output resistors and correspond to resistors R1 & R2 in FIG. 4. Capacitors C1 & C2 are connected between the collectors of Q1 & Q2 and the emitter of Qx. The capacitors C1 & C2 correspond to capacitors C1 & C2 in FIG. 4 and together form a mixer feedback 502. $V_{BB}$ is a baseband output of the mixer, $V_{LO}$ is an LO signal, and $V_{RF}$ is an RF input to a low noise amplifier.

In operation, the mixer signal current $i_s$ will asymptotically approach:

$$i_s \approx \frac{V_{RF}}{R_e} \tag{11}$$

when the loop gain increases. As $i_s$ does so, the compression point will begin to be controlled by clipping in the mixer signal current $i_s$ and not by any input device non-linearity. Thus, it becomes possible to decouple the compression point from the operation of the input device. Since the feedback capacitors C1 & C2 will approximate short circuits at high frequencies (e.g., RF), the baseband output will have a common-mode component equal to $V_{RF}$, which is tractable for most blocking requirements. In some embodiments, additional low-pass filtering of $V_{BB}$ may be implemented for improved performance.

Since Equation (11) is valid for reasonably high loop gains (e.g., above 10-20 dB), taking Equation (9) into consideration, the baseband output $V_{BB}$ can be written as:

$$V_{BB} \approx \frac{2i_s}{\pi} * R_{BB} \approx V_{RF} \frac{2}{\pi} \frac{R_{BB}}{R_e} \tag{12}$$

where $R_{BB}$ is the low frequency loading on the mixer output (which can be of much higher impedance than the high frequency loading). The factor $$\frac{2}{\pi}$$

is a result of the frequency translation process, but otherwise the baseband output $V_{BB}$ is proportional to the input signal (minus the desired frequency shift).

An advantage of the above mixer arrangement is the bandwidth of $V_{BB}$ is primarily limited by the tuning range of the LO (e.g., a VCO) and the low noise amplifier input match. The selectivity is approximately equal to the baseband gain, or $$\frac{2}{\pi} \frac{R_{BB}}{R_e},$$

for the configuration of FIG. 5 before any other filtering is considered. Similar expressions may be developed for other configurations. Another advantage is that the mixer may be implemented entirely as an integrated circuit (i.e., no non-ASIC components are required).

Figure 6:
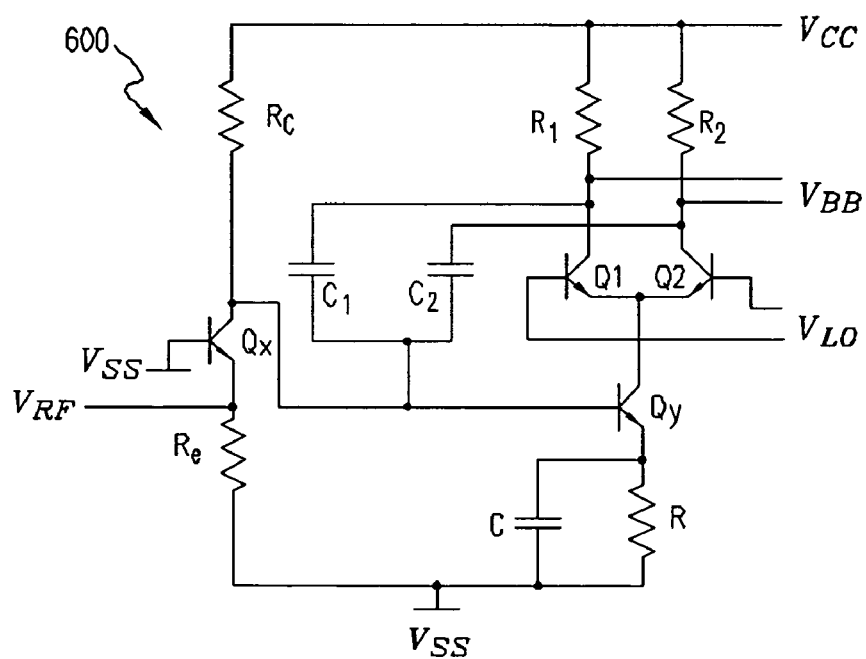
FIG. 6 is a circuit diagram showing a portion of an exemplary receiver having a common-base low noise amplifier with shunt feedback according to embodiments of the invention.

Following are exemplary implementations of other types of mixers that may be used in accordance with embodiments of the invention. Persons having ordinary skill in the art will recognize the advantages and benefits these various exemplary implementations. FIG. 6, for example, illustrates a common-base low noise amplifier with shunt feedback mixer 600 that is similar to the mixer of FIG. 5, except that the feedback capacitors C1 & C2 are connected to the collector of transistor Qx.

Figure 7:
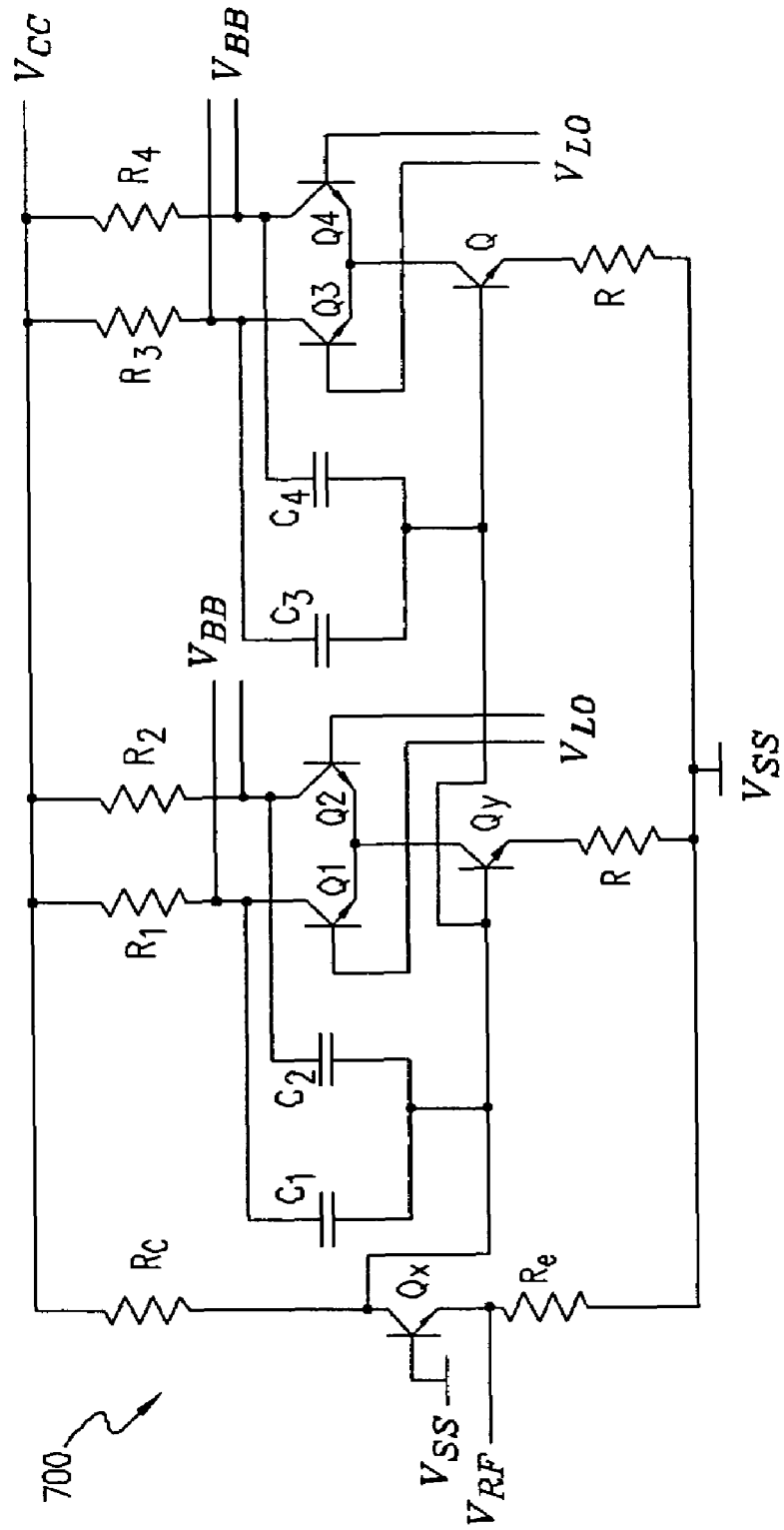
FIG. 7 is a circuit diagram showing a portion of an exemplary receiver having a common-base low noise amplifier with in-phase and quadrature shunt feedback according to embodiments of the invention.

FIG. 7 illustrates an exemplary mixer 700 according to embodiments of the invention, implemented using a common-base low noise amplifier with in-phase and quadrature shunt feedback. The mixer 700 in FIG. 7 is similar to the mixer 600 of FIG. 6, except the local oscillator signal $V_{LO}$ is applied to both the in-phase (Q1 & Q2) and quadrature (Q3 & Q4) inputs of the mixer. In FIG. 7, feedback resistors R3 & R4 as well as capacitors C3 & C4 perform similar functions as their counterparts R1 & R2 and C1 & C2.

Figure 8:
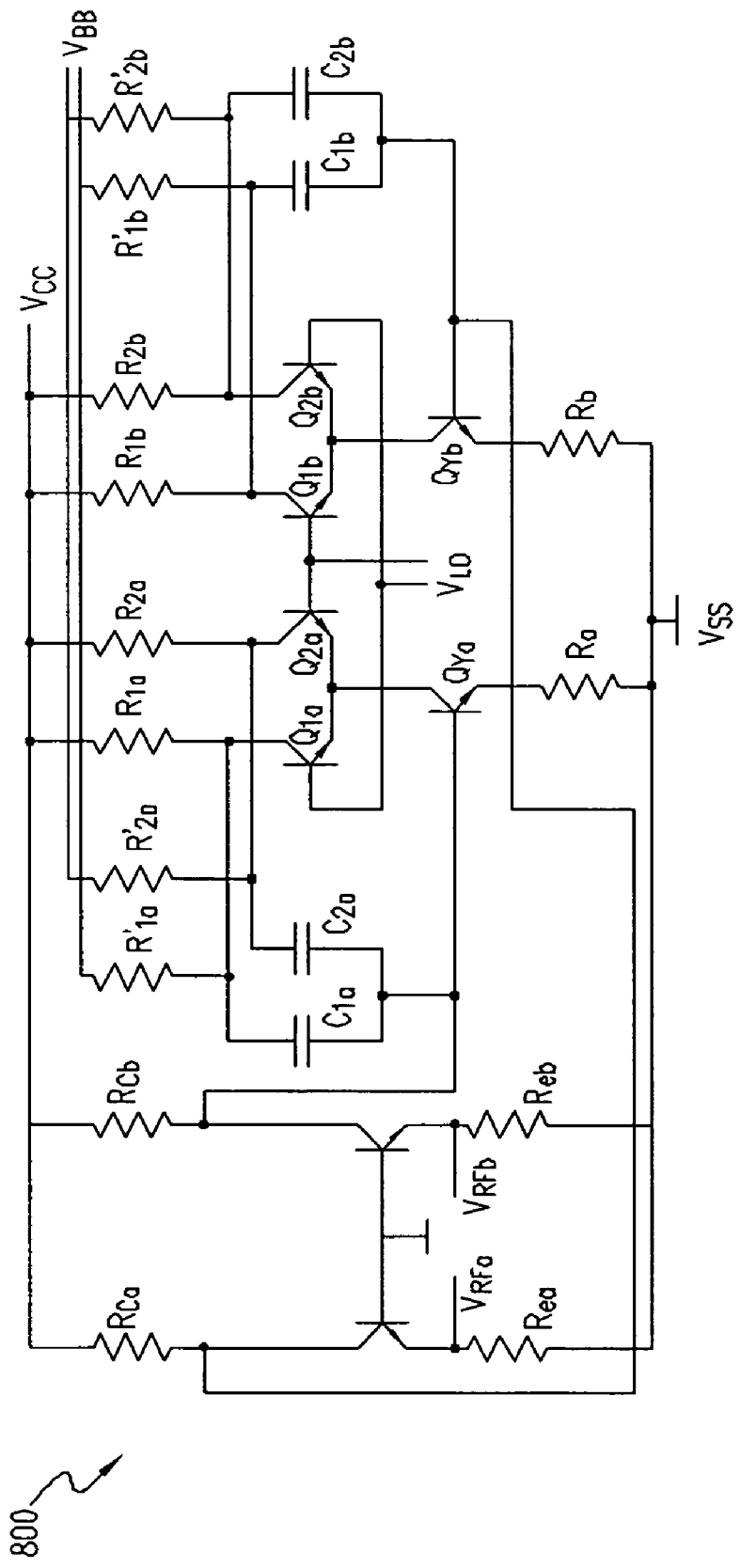
FIG. 8 is a circuit diagram showing a portion of an exemplary receiver having a differential common-base low noise amplifier with mixer shunt feedback according to embodiments of the invention.

FIG. 8 illustrates an exemplary mixer 800 according to embodiments of the invention, implemented using a differential common-base low noise amplifier with mixer shunt feedback. As can be seen, the mixer 800 of FIG. 8 is a balanced version of the mixer 600 of FIG. 6 (where subscripts "a" and "b" denote the two balanced paths), with a balanced low noise amplifier and a double-balanced mixer. Here, the term double-balanced refers to both the RF input and the baseband output being balanced, as opposed to the mixer 600 in FIG. 6, which has a single-balanced mixer with one RF input and a balanced baseband output.

Figure 9:
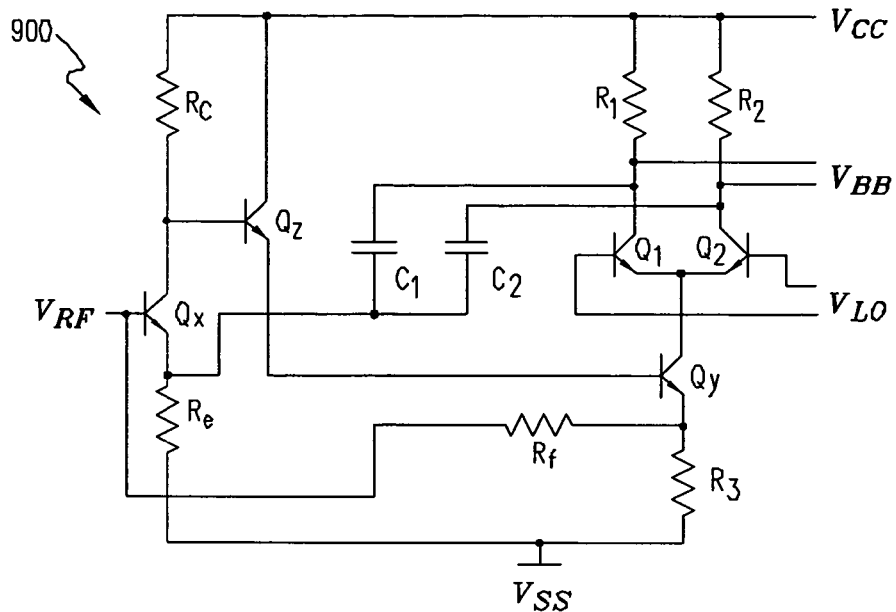
FIG. 9 is a circuit diagram showing a portion of an exemplary receiver having a common-emitter low noise amplifier with dual loop mixer feedback according to embodiments of the invention.

FIG. 9 illustrates an exemplary mixer 900 according to embodiments of the invention, implemented using a common-emitter low noise amplifier with dual loop mixer feedback. As can be seen, the mixer in FIG. 9 includes a low noise amplifier composed of Qx, Qz, and Qy together with a single-balanced mixer core Q1 & Q2. The mixer 900 has two feedback loops, with C1 & C2 and Re setting the voltage gain, and Rf and R3 setting the current gain. As a result, the input impedance of the mixer 900 will be defined by the is two loops when the loop gains are high. Assuming high loop gains, the input impedance can be approximated as $Z_{in}=Re(1+Rf/R3)$ for RF frequencies.

Figure 10:
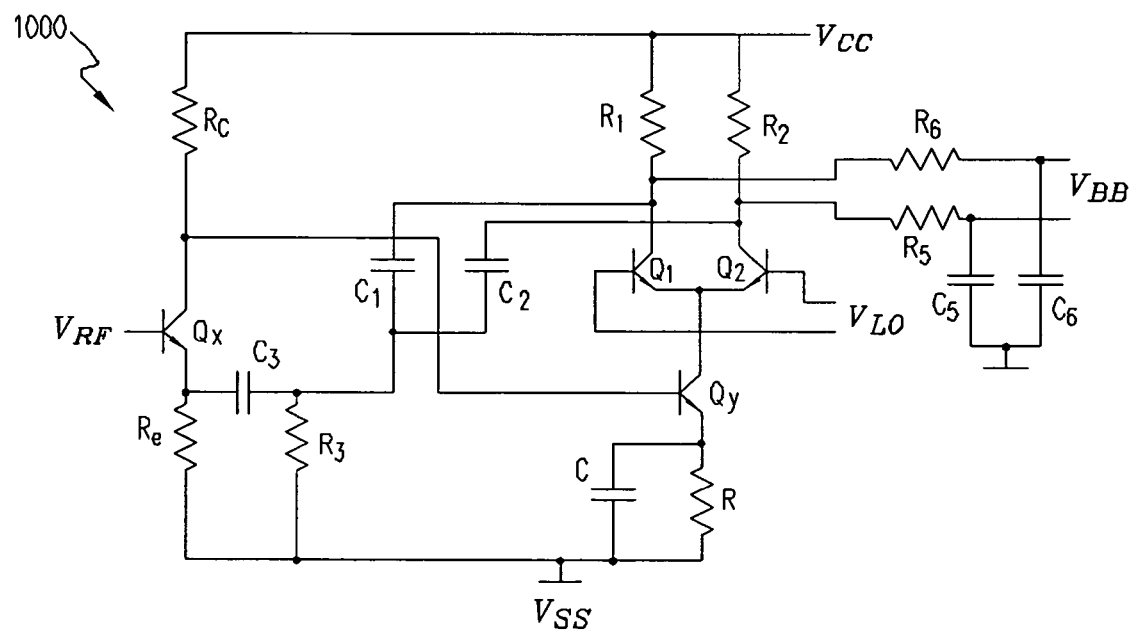
FIG. 10 is a circuit diagram showing a portion of an exemplary receiver having a common-emitter low noise amplifier with a higher-order mixer feedback according to embodiments of the invention.

FIG. 10 illustrates an exemplary mixer 1000 according to embodiments of the invention, implemented using a common-emitter low noise amplifier with a higher-order mixer feedback. In FIG. 10, resistor R3 and capacitor C3 add another high-pass pole to the feedback network, making the cut-off slope steeper. That is, the attenuation of the signal changes more rapidly with frequency. Similarly, resistors R4 & R5 and capacitors C4 & C5 add another low-pass pole at the baseband output to increase the suppression of the RF signal at the mixer output. Thus, by using a higher-order mixer feedback, better selectivity may be achieved. But there may be some limitation due to stability constraints and, therefore, care has to be exercised when using this implementation.

In addition to the foregoing embodiments, other combinations of feedback structures, including multi-loop feedback structures with a mix of pre-mixer and post-mixer feedback, are also possible. Furthermore, both first order networks and higher order networks may also be used. And while embodiments of the invention have been described with respect to an integrated receiver, the teachings of the present invention may be readily applied to non-integrated receivers as well.

Thus, while particular embodiments and applications of the present invention have been illustrated and described, it is to be understood that the invention is not limited to the precise construction and compositions disclosed herein, and that modifications and variations may be made to the foregoing without departing from the scope of the invention as defined in the appended claims.

What is claimed is:

1. A radio frequency receiver having feedback from a mixer of the receiver to an input stage of the receiver, the radio frequency receiver comprising:
 a low noise amplifier configured to receive a radio frequency signal, the radio frequency signal having a baseband signal carried thereon;
 a mixer configured to mix the radio frequency signal with a local oscillator signal, the mixer having at least a high-pass output path and a low-pass output path; and
 a feedback network connecting the mixer to the low noise amplifier, the feedback network providing a feedback signal from the high-pass output path to the low noise amplifier, the feedback signal having the same radio frequency as the received radio frequency signal, wherein the radio frequency receiver is implemented using a common-base low noise amplifier with shunt feedback and the feedback network is connected to a collector of the low noise amplifier.

* * * * *